US009606183B2

(12) United States Patent
Moon et al.

(10) Patent No.: US 9,606,183 B2
(45) Date of Patent: Mar. 28, 2017

(54) PSEUDO TESTER-PER-SITE FUNCTIONALITY ON NATIVELY TESTER-PER-PIN AUTOMATIC TEST EQUIPMENT FOR SEMICONDUCTOR TEST

(71) Applicants: Gerald Moon, Fort Collins, CO (US); Ira Harris Leventhal, San Jose, CA (US); Ron Larson, Fort Collins, CO (US); Sangeet Karamchandani, Union City, CA (US)

(72) Inventors: Gerald Moon, Fort Collins, CO (US); Ira Harris Leventhal, San Jose, CA (US); Ron Larson, Fort Collins, CO (US); Sangeet Karamchandani, Union City, CA (US)

(73) Assignee: ADVANTEST CORPORATION, Tokyo (JP)

( * ) Notice: Subject to any disclaimer, the term of this patent is extended or adjusted under 35 U.S.C. 154(b) by 1073 days.

(21) Appl. No.: 13/656,684

(22) Filed: Oct. 20, 2012

(65) Prior Publication Data

US 2014/0114603 A1    Apr. 24, 2014

(51) Int. Cl.
*G01R 31/319* (2006.01)

(52) U.S. Cl.
CPC .. *G01R 31/31907* (2013.01); *G01R 31/31926* (2013.01)

(58) Field of Classification Search
CPC ................... G01R 21/2851; G01R 31/31907
See application file for complete search history.

(56) References Cited

U.S. PATENT DOCUMENTS

| 4,744,084 A * | 5/1988 | Beck ................... G06F 17/5022 |
| | | 324/73.1 |
| 5,461,310 A | 10/1995 | Cheung et al. |
| 2003/0005375 A1 | 1/2003 | Krech, Jr. et al. |
| 2010/0213950 A1 | 8/2010 | Liu et al. |
| 2011/0191398 A1* | 8/2011 | Mueller ................. G06F 7/544 |
| | | 708/207 |

FOREIGN PATENT DOCUMENTS

| JP | 2009008683 | 1/2009 |
| KR | 20050045731 | 5/2005 |

* cited by examiner

*Primary Examiner* — Manuel Rivera Vargas

(57) ABSTRACT

A system and method for testing devices are presented. Embodiments of the present invention use a central controller to coordinate the testing of a plurality of devices under test as well as a plurality of channel circuits that are each operable to be coupled to at least one I/O pin of a device under test of the aforementioned plurality of devices under test. Also, embodiments of the present invention include a plurality of intermediate processors that are each coupled to the central controller and operable to receive and send control signals. These intermediate processors are each coupled to a different set of channel circuits of the plurality of channel circuits and are operable to execute their own instantiation of a test program that is independent of any other intermediate processor of the plurality of intermediate processors for the testing of a device under test associated therewith.

21 Claims, 10 Drawing Sheets

Tester-Per-Site System

Tester-Per-Pin System

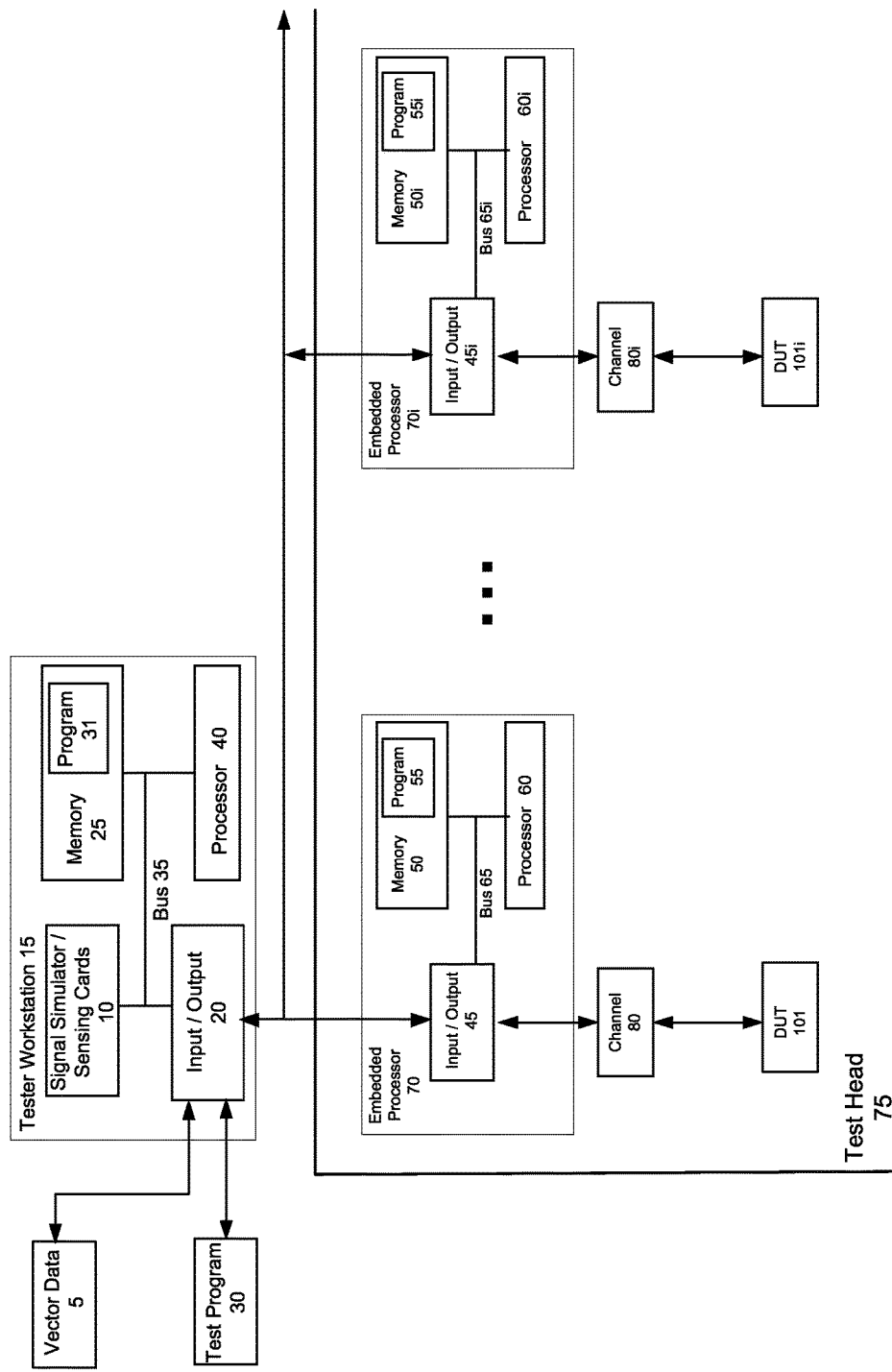

Multi-Threading Process

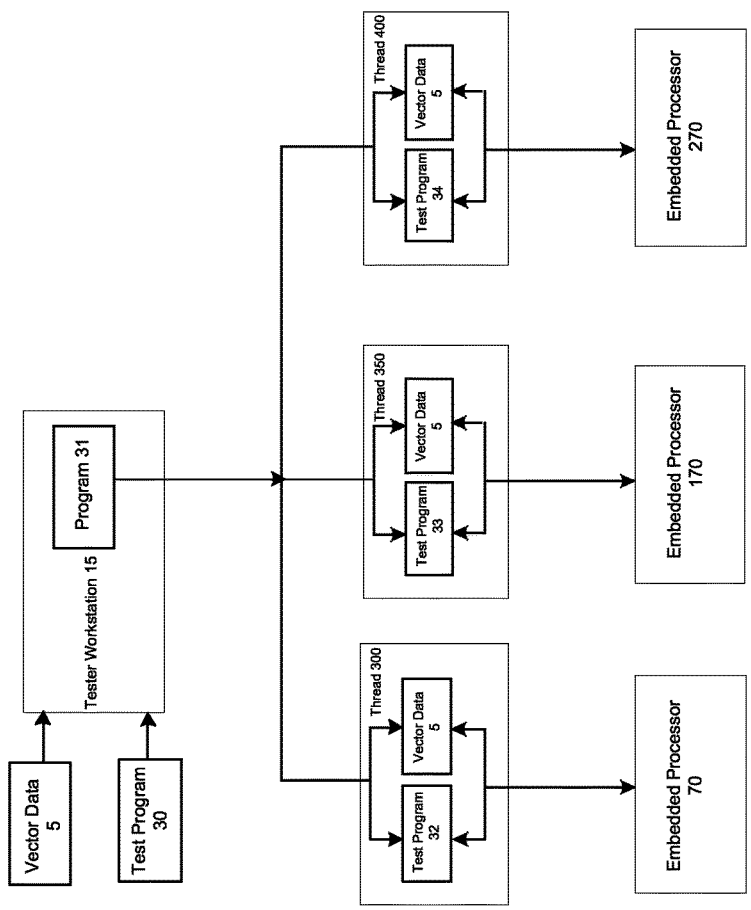

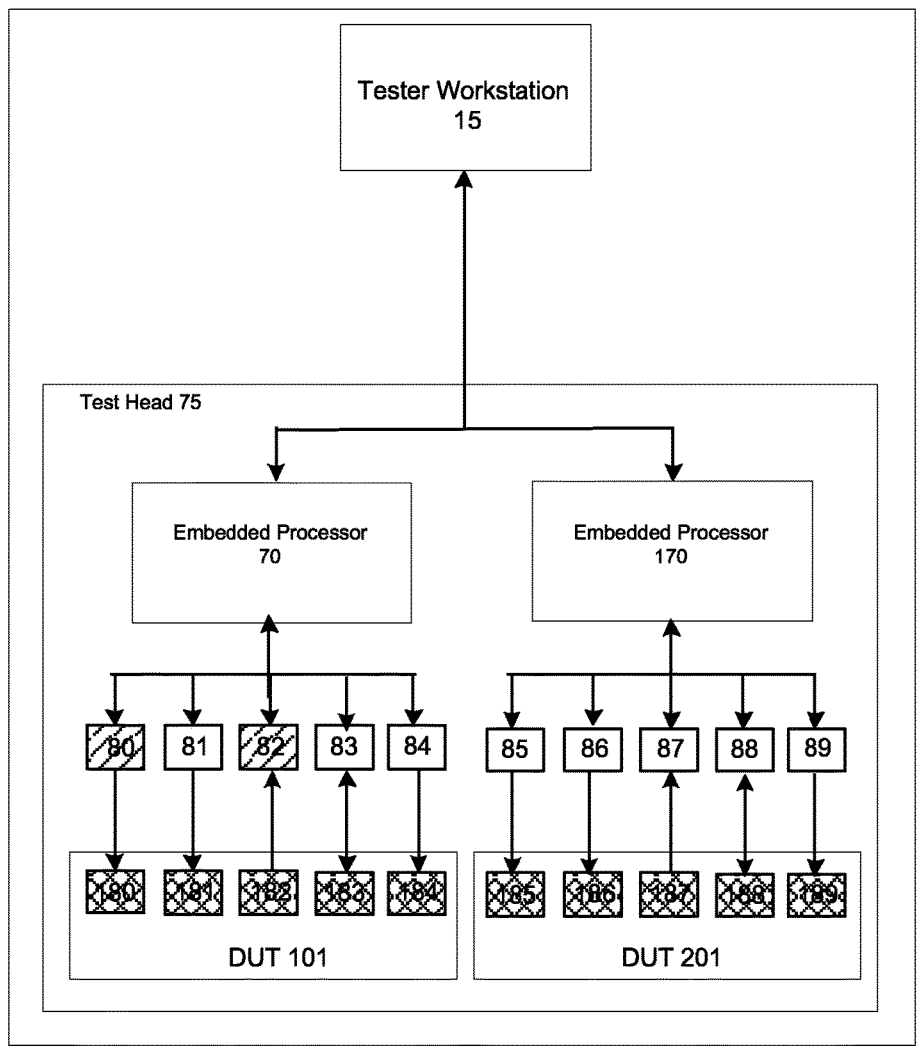
Figure 4C
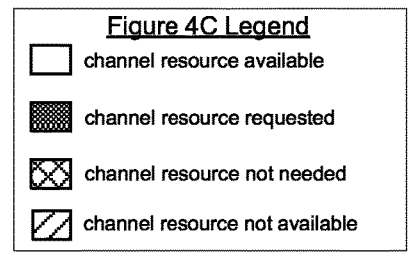

Flow Diagram 500

PSEUDO TESTER-PER-SITE FUNCTIONALITY ON NATIVELY TESTER-PER-PIN AUTOMATIC TEST EQUIPMENT FOR SEMICONDUCTOR TEST

FIELD OF THE INVENTION

Embodiments of the present invention generally relate to Automatic Test Equipment (ATE) for testing electronic components.

BACKGROUND

Automatic Test Equipment (ATE) is commonly used within the field of electrical chip manufacturing for the purposes of testing electronic components. ATE systems both reduce the amount of time spent on testing devices to ensure that the device functions as designed and serve as a diagnostic tool to determine the presence of faulty components within a given device before it reaches the consumer.

Presently, there are two types of systems for testing system-on-chip semiconductor devices: Tester-Per-Site (TPS) and Tester-Per-Pin (TPP). The TPS system groups together a number of test functions that may be performed on each device under test (DUT) within what may be referred to as a "test site." In a real time testing environment, a TPS system includes testing several DUTs on several test sites with one resource station available to provide testing resources for each site. FIG. 1A provides a depiction of a conventional Tester-Per-Site system (TPS). As illustrated by FIG. 1A, resources 1, 2, 3 and 4 comprise a pool of per-site resources dedicated to testing DUT 101 when connected to their corresponding pins located in DUT 101 (pins 6, 7, 8 and 9 respectively).

This particular architecture provides for test flow flexibility in the sense that each device is tested independently, which decreases potential bottlenecking caused by failing devices. However, implementation of this architecture may also come at the expense of wasting testing resources since each resource cannot be shared among multiple sites during the test phase. Furthermore, the TPS system's dedicated testing approach, in which all testing resources are focused on a single DUT, may result in wasted resources for devices that do not require those resources, thus resulting in resource inefficiencies. An example of the TPS system is disclosed in U.S. Pat. No. 6,779,140 "Algorithmically Programmable Memory Tester with Test Site Operating in a Slave Mode."

The competing TPP system provides a range of analog and digital drive and receive capabilities which may operate independently of each other. Through the use of "pins", the TPP system assigns each pin of the tester device to provide a specific resource capable of supporting a test. FIG. 2B provides a depiction of a conventional Tester-Per-Pin system (TPP). The TPP system supports the use of multiple tester "channels" to test multiple DUTs on multiple test sites when testing in parallel. As depicted in FIG. 1B, channels 80 through 94 provide various tester resources to DUT 101 once the channels are connected to their respective pins (180 through 184) located on DUT 101. It is understood that channels 85 through 89 and 90 through 94 may be configured in a similar manner as channels 80 through 84 with regards to their respective DUTs (201 and 301 respectively).

However, when testing in parallel under the TPP system, multi-site inefficiency problems exist. Although tester workstation 15 is able run multiple tests on multiple DUTs, these tests must be kept in lock step. For example, in the event that DUT 101 reports a failure, channels 80 through 84 must wait while DUTs 201 and 301 finish testing before channels 80 through 84 can be re-initialized and reassigned to test another device. Additionally, DUT 101 may require a longer testing period than DUT 201, thus tying up available channels that may be better utilized on another DUT. Therefore, although multiple devices may be tested in parallel under this approach, test flow is dependent upon the completion of the longest test to finish on a DUT. An example of the TPP system is disclosed in U.S. Pat. No. 5,461,310 "Automatic Test Equipment System Using Pin Slice Architecture."

SUMMARY OF THE INVENTION

Accordingly, a need exists for a tester system and/or method that can address the problems with the systems described above. Using the beneficial aspects of the systems described, without their respective limitations, embodiments of the present invention provide a novel solution to address these problems.

Embodiments of the present invention combine the TPS and TPP architectures by intelligently grouping TPP resources into pseudo test sites. This overcomes the limitations of either architecture on its own: Signal resources can be efficiently allocated for optimal signal integrity and load board routing while allowing per-site test program control to minimize test time. In this novel architecture, the test flow for each site is distributed to processing elements located within the test head.

By moving test program control down to embedded processors in the test head, the problems associated with multi-threading of test program control in the tester workstation are eliminated. The eases test program development, debug and maintenance. Multi-threading can only be done at the tester workstation level to support distributing test programs and vector data to the sites and collecting pass/fail data as tests complete.

Embodiments of the present invention also make it possible to reduce the number of test insertions needed to diagnose failed devices. Current industry practice has failed devices being sent back to Engineering, where they are re-installed on a tester to run additional testing in order to diagnose the failure in support of process or design improvements to increase test yield of the device. This novel architecture makes it possible to run additional testing on failed devices during the initial test insertion, making use of the tester time and resources that would otherwise be wasted as the failed device sits idle while other devices on the tester finish the complete test program.

More specifically, in one embodiment, the present invention is implemented as a tester system for testing devices. The system includes a central controller for coordinating the testing of a plurality of devices under test. In one embodiment, the central controller may be a tester workstation (e.g. a computer). The system also includes a plurality of channel circuits that are each operable to be coupled to at least one I/O pin of a device under test of the plurality of devices under test. In one embodiment, the plurality of channel circuits may be clock pin channel circuits; analog input channel circuits; analog output channel circuits; and/or digital input/output channel circuits.

The system further includes a plurality of intermediate processors that are each coupled to the central controller and operable to receive and send control signals. In one embodiment, the intermediate processors may be embedded processors that are coupled to the central controller and operable to receive their respective vector data. Each intermediate processor may independently execute their respective instantiation of a test program for testing an associated device under test using an associated set of channel circuits.

Furthermore, each intermediate processor may be coupled to a different set of channel circuits from the plurality of channel circuits, which enable each intermediate processor to execute their respective instantiations of the test program for each of their associated devices under test. Each intermediate processor may execute their respective test programs for testing a first set of devices under test in lock step execution. In one embodiment, each intermediate processor may independently execute different test programs.

In another embodiment, the present invention is implemented as a method for testing devices. The method includes coordinating the testing of a plurality of devices under test using a central controller. In one embodiment, the central controller may be a tester workstation (e.g. a computer). The method also includes coupling a plurality of channel circuits to at least one I/O pin of a device under test of the plurality of devices under test where each channel circuit is operable to be coupled to at least one I/O pin of a device under test of the plurality of devices under test. In one embodiment, the plurality of channel circuits may be clock pin channel circuits; analog input channel circuits; analog output channel circuits; and/or digital input/output channel circuits.

The method embodiment further includes associating a plurality of intermediate processors that are each coupled to the central controller and operable to receive and send control signals to the central controller which is capable of monitoring the operational status of the plurality of channel circuits. In one embodiment, the intermediate processors may be embedded processors that are coupled to the central controller and operable to receive their respective vector data. Each intermediate processor may independently execute their respective instantiation of a test program for testing an associated device under test using an associated set of channel circuits that each intermediate processor is coupled to.

Furthermore, the method embodiment includes associating each intermediate processor of the plurality of intermediate processor to a different set of channel circuits from the plurality of channel circuits, which enable each intermediate processor to execute their respective instantiations of the test program for each of their associated devices under test. Each intermediate processor may execute their respective test programs for testing a first set of devices under test in lock step execution. In one embodiment, each intermediate processor may independently execute different test programs.

In yet another embodiment, the present invention is implemented as a tester system for testing devices. The system includes a central controller for coordinating the testing of a plurality of devices under test. In one embodiment, the central controller may be a tester workstation (e.g. a computer). The system also includes a plurality of channel circuits that are each operable to be coupled to at least one I/O pin of a device under test of the plurality of devices under test. In one embodiment, the plurality of channel circuits may be clock pin channel circuits; analog input channel circuits; analog output channel circuits; and/or digital input/output channel circuits.

The system further includes a plurality of intermediate processors that are each coupled to the central controller and operable to receive and send control signals. In one embodiment, the intermediate processors may be embedded processors that are coupled to the central controller and operable to receive their respective vector data. Each intermediate processor may execute a set of instructions of a respective instantiation of a test program for testing an associated device under test using an associated set of channel circuits that each intermediate processor is coupled to.

Furthermore, each intermediate processor may be coupled to a different set of channel circuits from the plurality of channel circuits, which enable each intermediate processor to execute their respective instantiations of the test program for each of their respective devices. Each intermediate processor may execute a set of instructions of a respective instantiation of a test program concurrently for the testing of an associated device under test.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure

FIG. 2A depicts an exemplary tester system upon which embodiments of the present invention may be implemented.

FIG. 2C depicts another exemplary multi-threaded process upon which embodiments of the present invention may be implemented.

FIG. 4C depicts another exemplary resource allocation process diagram of an automated tester system in accordance with embodiments of the present invention.

DETAILED DESCRIPTION

Figure 1A:
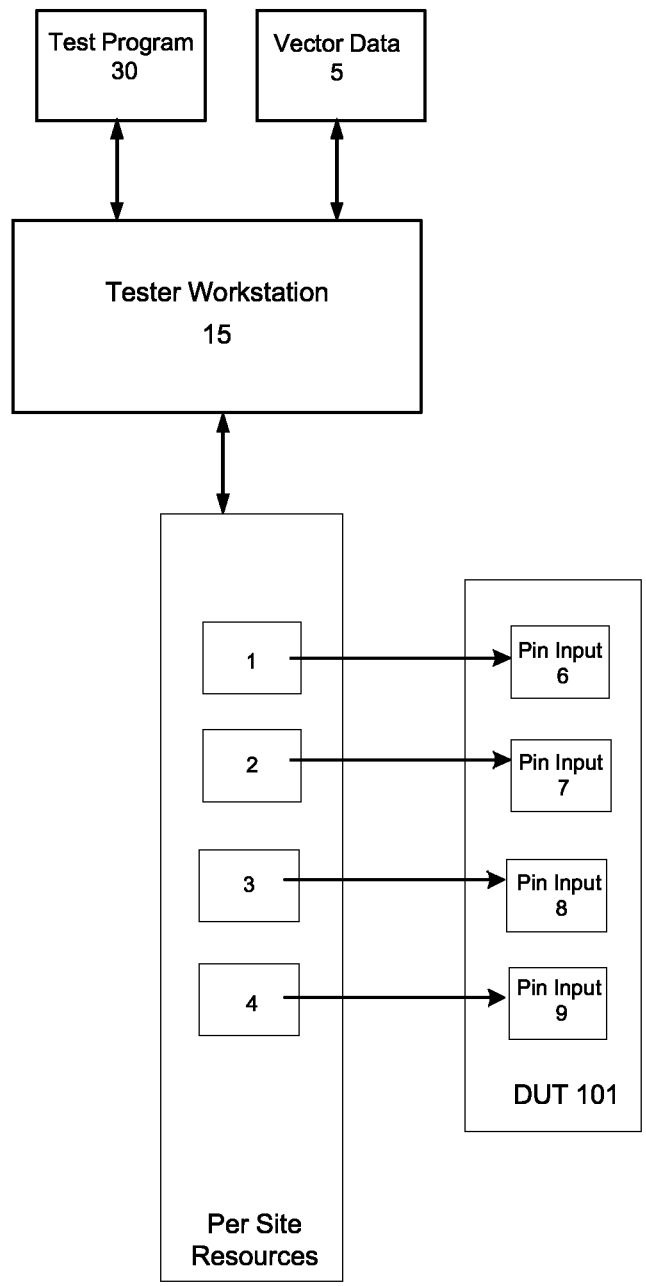
FIG. 1A depicts a conventional automated tester system.
Figure 1B:
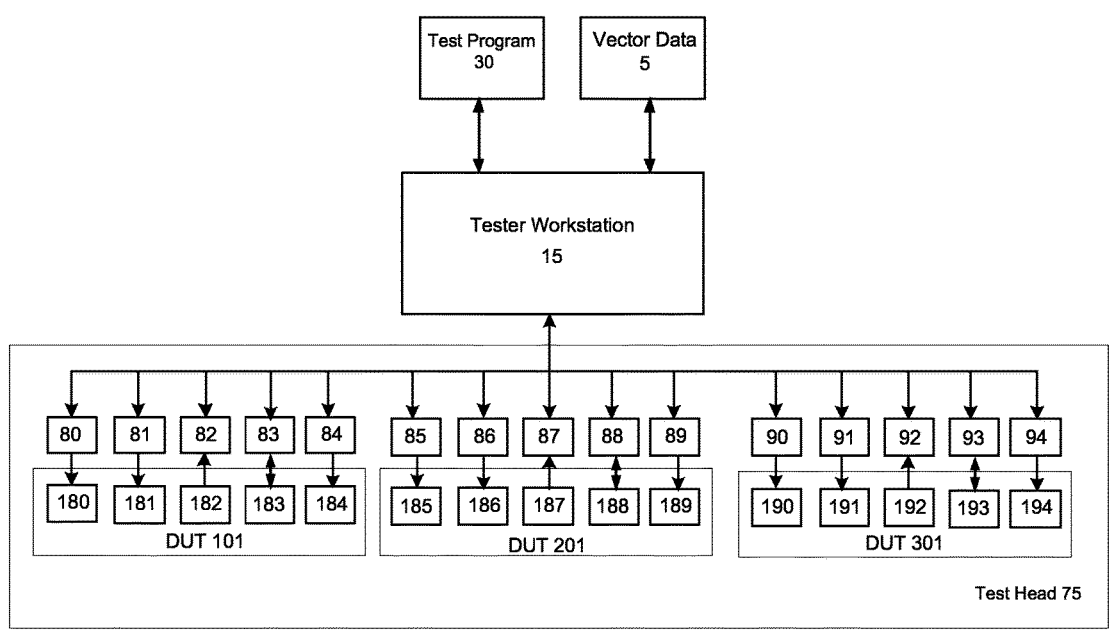
FIG. 1B depicts another conventional automated tester system.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Portions of the detailed description that follow are presented and discussed in terms of a process. Although operations and sequencing thereof are disclosed in a figure herein (e.g., FIG. 5) describing the operations of this process, such operations and sequencing are exemplary. Embodiments are well suited to performing various other operations or variations of the operations recited in the flowchart of the figure herein, and in a sequence other than that depicted and described herein.

As used in this application the terms controller, module, system, and the like are intended to refer to a computer-related entity, specifically, either hardware, firmware, a combination of hardware and software, software, or software in execution. For example, a module can be, but is not limited to being, a process running on a processor, an integrated circuit, an object, an executable, a thread of execution, a program, and/or a computer. By way of illustration, both an application running on a computing device and the computing device can be a module. One or more modules can reside within a process and/or thread of execution, and a component can be localized on one computer and/or distributed between two or more computers. In addition, these modules can be executed from various computer readable media having various data structures stored thereon.

As presented in FIG. 2A, an exemplary tester system 100 upon which embodiments of the present invention may be implemented is depicted. In an embodiment, tester system 100 may be implemented within any testing system capable of testing multiple electronic components individually or in parallel.

Tester workstation 15 serves as a controller within tester system 100 and may be used for the purposes of interfacing with DUT 101 through embedded processor 70 via input/output 45. Multiple embedded processors 70i may be housed in test head 75. Although a single embedded processor 70 is described below, embodiments of the present invention support multiple embedded processors as shown in FIG. 2A (embedded processor 70i). Furthermore, each embedded processor is operable to independently test their respective DUTs. Embodiments of the present invention may also support multiple input/output devices.

Vector data 5 and test program 30 are received from input/output 20 and stored in memory 25. Test program 30 contains instructions which provide a number of testing services including test procedures, test result retrieval as well as failure determination analysis using vector data 5. Furthermore, test program 30 may provide synchronization instructions which read and measure testing data at the proper times.

Using processor 40, program 31, stored in memory 25, reads in the vector data 5 as well as the instructions from test program 30. Using a multi-threaded programming model, program 31 then creates a thread providing instructions from test program 30 as well as vector data 5 for each embedded processor present within the tester system, such as embedded processor 70. Embodiments of the present invention allow for the possibility of sharing test programs through separate threads across multiple embedded processors. Embedded processor 70 then executes its own instantiation 55 of the test program, shown stored in memory 50. Each embedded processor executes its own program independently of the other embedded processors.

Vector data 5 may consist of signal data which may be stimuli that is either applied to a DUT or the data may be in the form of measured responses from the DUT. Stimulus signals may be in the form of 1's and 0's depicting various logical states or characterized as voltages. Vector data may further be depicted as a sequential pattern consisting of 1's and 0's.

Furthermore, tester workstation 15 may be equipped to accommodate signal simulator or signal sensing cards 10. Using data stored in vector data 5, processor 40 processes instructions from test program 30 to either send simulation signals to DUT 101 or read signals from DUT 101 wherein the signal data recorded from DUT 101 may be measured for failure determination analysis. Signals are used for providing testing resources such as clocking resources, analog input channel circuits, analog output channel circuits, digital input/output channel circuits, as well as power supplies.

Using tester workstation 15 in the manner described allows tester workstation 15 to focus more on gathering failure information from failed devices or perform failure analysis and, thus, increase test efficiency. Using tester workstation 15 in the manner described also allows it to act as a monitor that coordinates the reallocation and reassignment of existing tester resources that may be needed by a particular DUT. Accordingly, tester workstation 15 possesses the ability to reassign tester resources provided by a channel, such as channel 80, to another test site in need of the resource provided by that channel.

Test head 75 provides an interface between tester workstation 15 and DUT 101 within tester system 100 through input/outputs 20 and 45. Furthermore, test head 75 provides the test resources used to perform the testing on DUT 101, such as channel 80. In a parallel testing scheme in which multiple DUTs are tested in lock step fashion, test head 75 may interface with a number of DUTs, thus, producing a number of test sites. Although FIG. 2A depicts a single test head, the embodiments of the present invention may support multiple test heads.

Embedded processor 70 may serve as an extension of tester workstation 15. Using the thread spawned by program 31, program instantiation 55, using processor 60, reads the vector data 5 and executes the instructions of test program 30 for each DUT, which may include sending or reading signals from DUT 101, as well as recording the results of a given test and passing that data to tester work station 15 through input/output 45 for possible failure determination analysis. Embedded processor 70 also has access to the instruments used to supply or read signals such as clocking resources, analog input channel circuits, analog output channel circuits, digital input/output channel circuits, as well as power supplies. Although FIG. 2A depicts embedded processor 70 having access to just channel 80, embodiments of the present invention support multiple embedded processors 70i having access to multiple channel resources.

Furthermore, embedded processor 70 may provide periodic status updates regarding the tests performed on DUT 101. For example, if DUT 101 fails, in addition to passing the results, embedded processor 70 may also pass real time data regarding the availability of the channel resources used at a particular site to tester workstation 15. Therefore, in a parallel testing environment, tester workstation 15 may be able to reallocate and reassign a particular channel resource under the jurisdiction of embedded processor 70, such as channel 80, to the test site of another DUT which may use the resource to perform testing. This results in fewer wasted resources and improves upon multi-site inefficiencies.

Figure 2B:
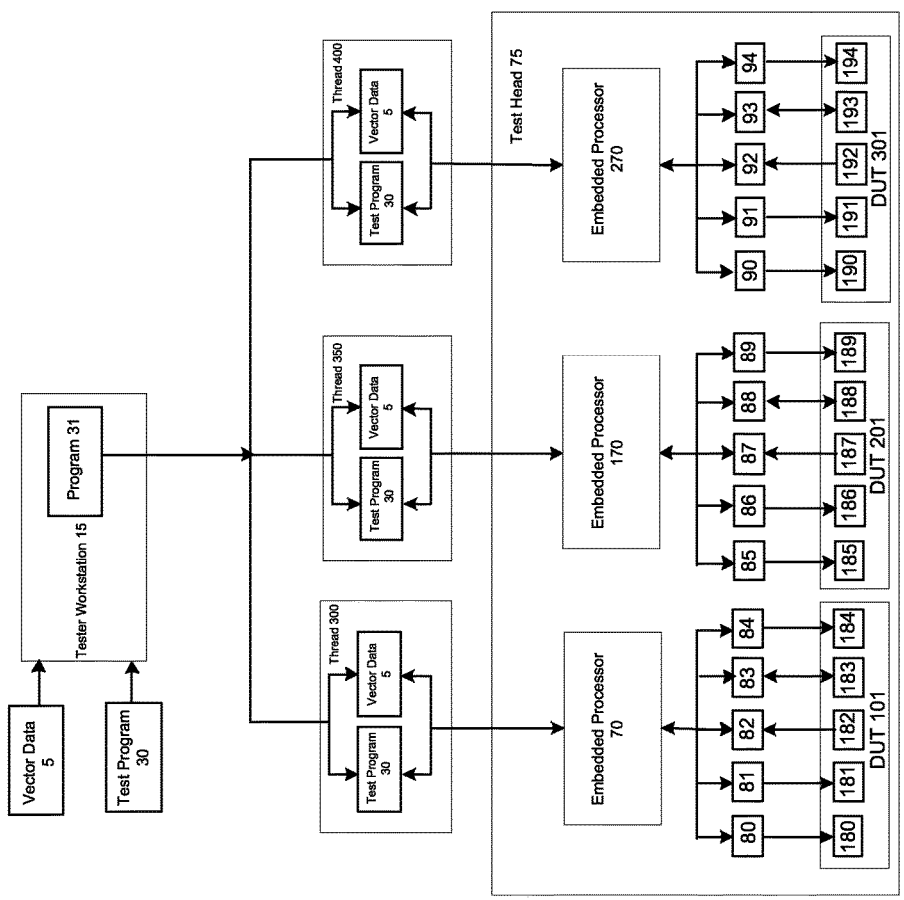
FIG. 2B depicts an exemplary multi-threaded process upon which embodiments of the present invention may be implemented.

FIG. 2B provides an exemplary multi-threading process upon which embodiments of the present invention may be implemented. In an embodiment, program 31 reads in the vector data 5 as well as test program 30. Using a multi-threaded programming model, program 31 allows for the multi-threaded execution of test program 30 using vector data 5 by embedded processors 70, 170 and 270 each having their own instantiation of program 30. As illustrated, thread 300 provides embedded processor 70 the instructions from test program 30 as well as the vector data 5. Also, thread 350 provides embedded processor 170 the instructions from test program 30 as well as the vector data 5. Similarly, thread 400 provides embedded processor 270 the instructions from test program 30 as well as the vector data 5. Therefore, embodiments of the present invention support concurrent execution of instantiations of test program 30 among a number of embedded processors.

Additionally, embodiments of the present invention support the multi-threaded execution of instructions of test program 30 within each embedded processor. For example, test controller 70 may execute each instruction of test program 30 concurrently. Therefore, embodiments of the present invention support testing systems in which a tester workstation and/or embedded processors may act as a distributed processing system.

FIG. 2C provides another exemplary depiction of the multi-threading process upon which embodiments of the present invention may be implemented. FIG. 2C further illustrates that embedded processors 70, 170 and 270 may each execute their own respective instantiations of program 30 that may be different from each other.

Figure 3A:
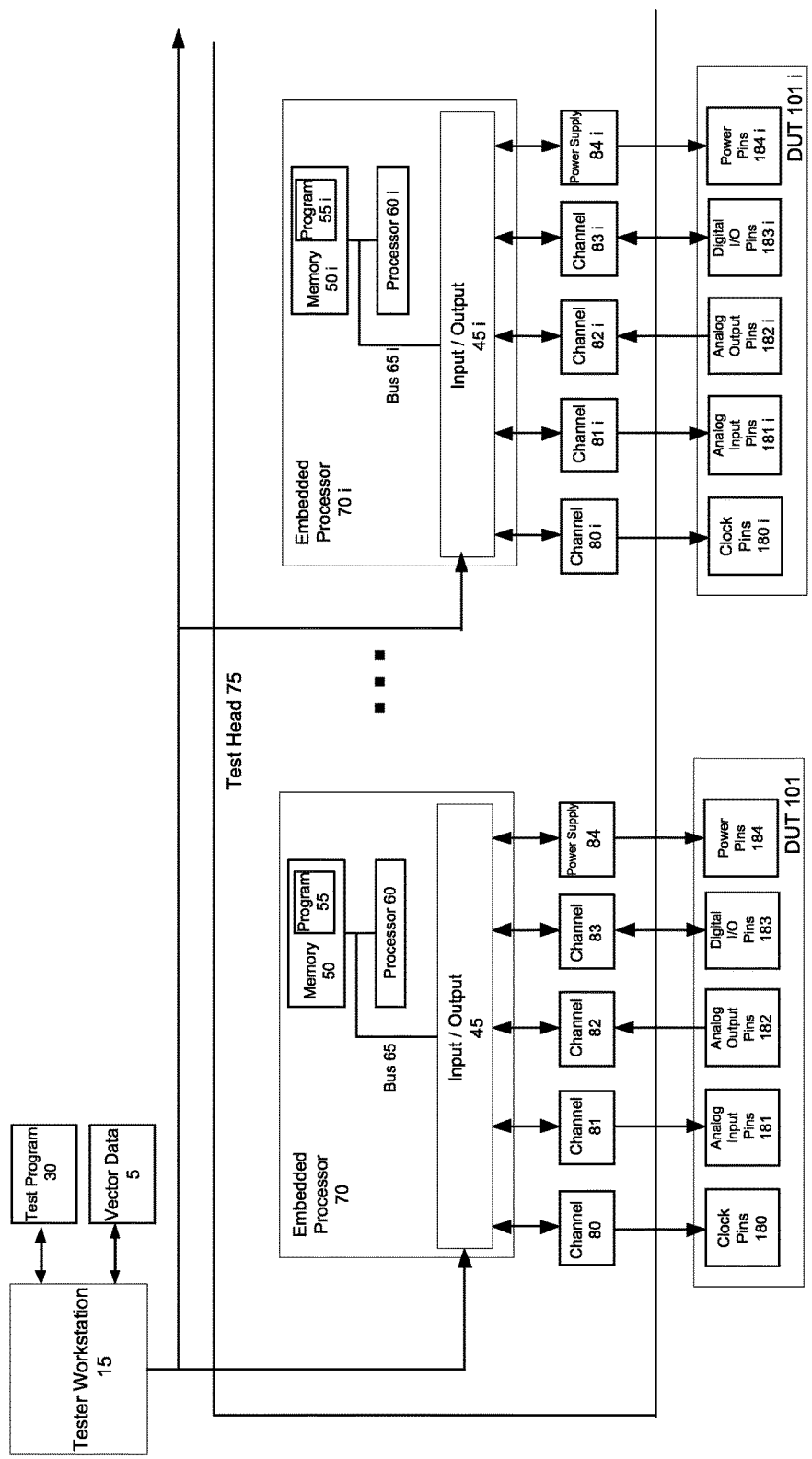
FIG. 3A is a diagram that depicts an exemplary automated tester system in accordance with embodiments of the present invention.

FIG. 3A is an exemplary depiction of a test site upon which embodiments of the present invention may be implemented. In an embodiment, embedded processor 70 may be implemented within any testing system capable of testing multiple electronic components individually or in parallel.

Embedded processor 70 may receive vector data 5 and test instructions from test program 30 via a thread spawned by program 31 running in tester workstation 15 through input/output 45. Vector data 5 may consist of signal data which may be stimuli that is applied to DUT 101 or the data may be in the form of measured responses from DUT 101. In addition to processing local instructions provided by program 55 pertaining to the execution of a test and passing the result to tester workstation 15, processor 60 may also process instructions from program 55 to provide status updates regarding the use of channel resources under the jurisdiction of embedded processor 70. For example, channel 80 of embedded processor 70 may provide clock testing resources to DUT 101. Additionally, channel 81 may provide analog stimuli signals while channel 82 may receive the outputted analog signals in response to the stimuli signals submitted by channel 81. Channel 83 may be configured to provide and receive digital stimuli signals from DUT 101 once the channel is connected to corresponding pin 183. Furthermore, channel 84 may be configured to supply power to DUT 101 through pin 184 as the device undergoes testing. Each channel may send periodic notifications to embedded processor 70 regarding its status. For example, channel 80 may indicate to tester workstation 15 that channel 80 is currently performing its assigned task according to test program 30 or that it has completed its assigned task and is waiting for further instructions.

Figure 3B:
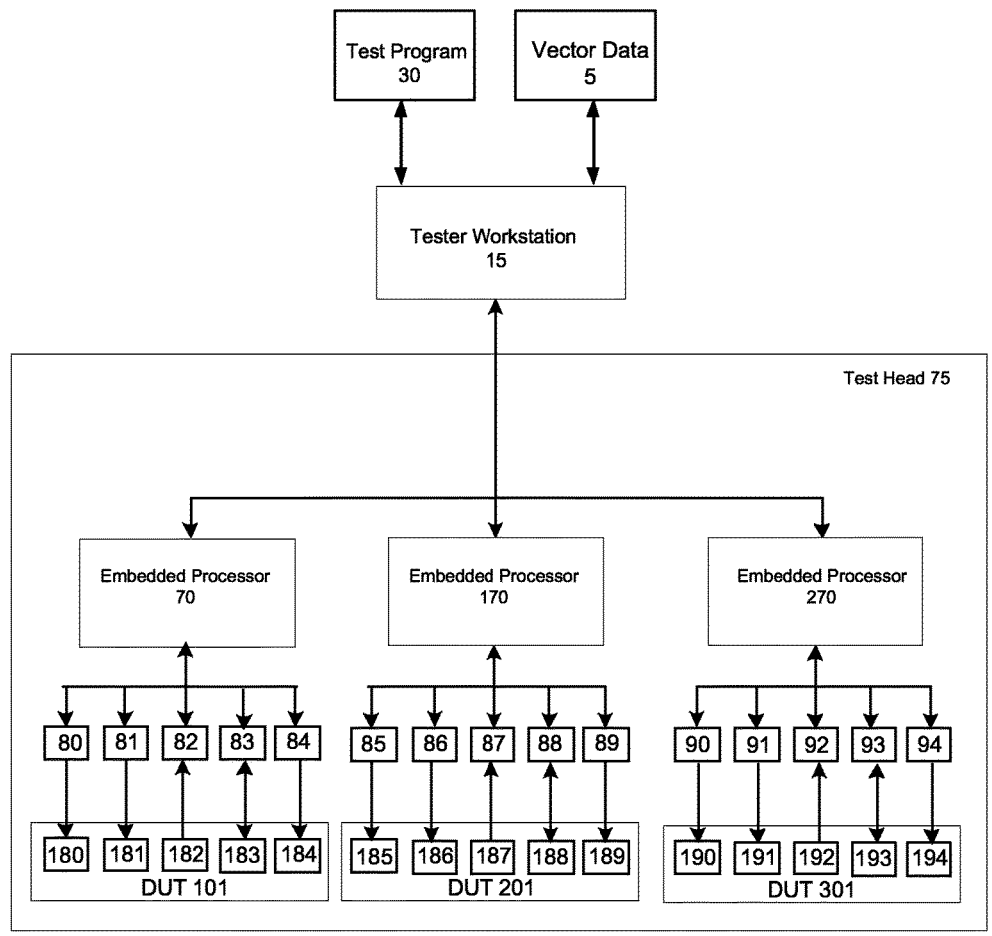
FIG. 3B is a diagram that depicts another exemplary automated tester system in accordance with embodiments of the present invention.

FIG. 3B provides an exemplary multi-site configuration scheme upon which embodiments of the present invention may be implemented. Embedded processors 70, 170, and 270 may each test their respective DUTs independently (101, 201 and 301). As in the previous example, channel 80 of embedded processor 70 may provide clock testing resources to DUT 101. Additionally, channel 81 may provide analog stimuli signals. Also, channel 82 may receive outputted analog signals in response to the stimuli signals submitted by channel 81. Channel 83 may be configured to provide and receive digital stimuli signals from DUT 101. Furthermore, channel 84 may be configured to supply power to DUT 101 through pin 184 as the device undergoes testing. Testing of DUT 101 may be initiated when channels 80 through 84 are connected to their respective pins on DUT 101 (pins 180 through 184) and power is supplied to DUT 101.

Similarly, channel 85 of embedded processor 170 may provide clock testing resources to DUT 201. Additionally, channel 86 may provide analog stimuli signals. Also, channel 87 may receive outputted analog signals in response to the stimuli signals submitted by channel 86. Channel 88 may be configured to provide and receive digital stimuli signals from DUT 201. Furthermore, channel 89 may be configured to supply power to DUT 201 through pin 189 as the device undergoes testing. Testing of DUT 201 may be initiated when channels 85 through 89 are connected to their respective pins on DUT 201 (pins 185 through 189) and power is supplied to DUT 201.

Furthermore, channel 90 of embedded processor 270 may provide clock testing resources to DUT 301. Additionally, channel 91 may provide analog stimuli signals. Also, channel 92 may receive outputted analog signals in response to the stimuli signals submitted by channel 91. Channel 93 may be configured to provide and receive digital stimuli signals from DUT 301. Furthermore, channel 94 may be configured to supply power to DUT 301 through pin 194 as the device undergoes testing. Testing of DUT 301 may be initiated when channels 90 through 94 are connected to their respective pins on DUT 301 (pins 190 through 194) and power is supplied to DUT 301.

Embedded processors 70, 170, and 270 each independently execute instructions to be locally performed on their respective devices using their respective channel resources. Also, embedded processors 70, 170, and 270 each receive vector data 5 and test instructions from test program 30 via a thread spawned by tester workstation 15. Furthermore, each embedded processor may provide tester workstation 15 with periodic status updates regarding the availability of each of their respective channel resources.

For example, if DUT 101 fails, in addition to passing the results, embedded processor 70 may also pass real time data regarding the availability of channels 80 through 84 to tester workstation 15. Therefore, in a parallel testing environment, tester workstation 15 may be able to reallocate and reassign channels 80 through 84 to the test site of another DUT which may use those channel resources to perform testing, which results in a more efficient use of channels 80 through 84. For tester workstation 15 to reassign channels 80 through 84, it must first communicate with embedded processor 70, which is in control of the channel resources desired by tester workstation 15.

Tester workstation 15 may also monitor what each embedded processor is doing and may communicate to a handler to bin out the DUT that is finished, gather failure information from the failed device or execute a failure analysis test. Tester workstation 15 also has the capabilities to gather another device and re-initialize testing. Embedded processors 70, 170 and 270 operate independently. Embodiments of the present invention allow embedded processors to receive either the same set of instructions or different sets of instructions to be executed on their respective devices under test.

Figure 4A:
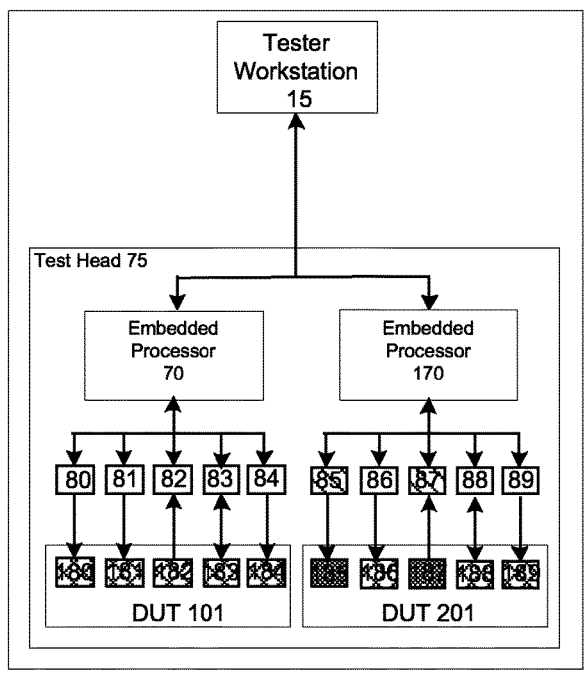
FIG. 4A depicts an exemplary resource allocation process diagram of an automated tester system in accordance with embodiments of the present invention.

FIG. 4A provides an exemplary depiction of the tester resource assignment scheme upon which embodiments of the present invention may be implemented. As in the previous example, channel 80 of embedded processor 70 may provide clock testing resources to DUT 101. Additionally, channel 81 may provide analog stimuli signals. Also, channel 82 may receive outputted analog signals in response to the stimuli signals submitted by channel 81. Channel 83 may be configured to provide and receive digital stimuli signals from DUT 101. Furthermore, channel 84 may be configured to supply power to DUT 101 through pin 184 as the device undergoes testing. Testing of DUT 101 may be initiated when channels 80 through 84 are connected to their respective pins on DUT 101 (pins 180 through 184) and power is supplied to DUT 101.

Additionally, FIG. 4A presents a scenario in which DUT 101 no longer requires the tester resources provided by channels 80 through 84 assigned to it (depicted as a shaded region) because it may be considered a "failed" device or does not require the resources that were assigned to it. Both channels 85 and 87 of embedded processor 170, are unable to provide clocking resources as well as resources to receive outputted analog signal responses which are requested by pins 185 and 187 of DUT 201 respectively (depicted as a shaded region).

In an embodiment of the present invention, embedded processor 70, through a status update, may alert tester workstation 15 that the channels under its jurisdiction (channels 80 through 84) are available to be reassigned. Alternatively, tester workstation 15 may detect that channels 80 and 82 are both no longer being utilized by DUT 101 and are available to be reassigned by tester workstation 15. Tester workstation 15, in turn, reallocates channels 80 and 82 which provide clocking resources as well as resources to receive outputted analog signal responses, which are the exact resources needed by embedded processor 170 to perform testing on DUT 201.

Figure 4B:
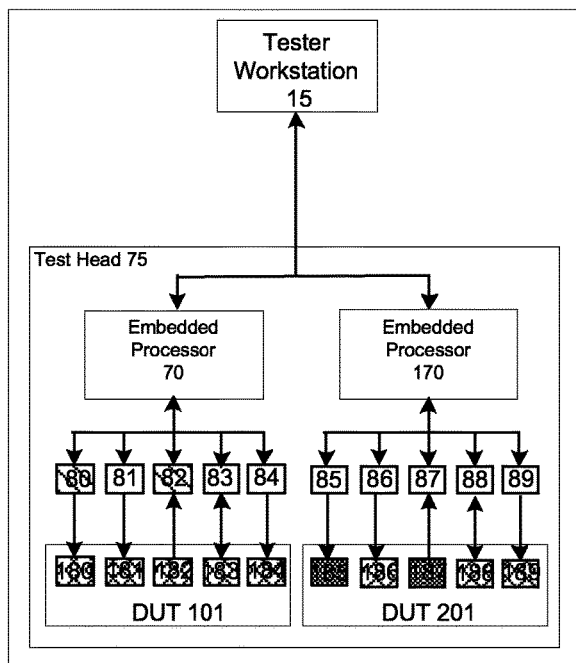
FIG. 4B depicts another exemplary resource allocation process diagram of an automated tester system in accordance with embodiments of the present invention.

As illustrated in FIG. 4B, tester workstation 15 makes a resource reassignment request to embedded processor 70 to make the desired tester resources available to embedded processor 170, which is granted by embedded processor 70. Shaded channels 80 and 82 belonging to embedded processor 70 illustrate that embedded processor 70 has accepted the request made by tester workstation 15 and has agreed to reallocate the clocking and measuring resources to the site testing DUT 201. Shaded channels 80 and 82 also indicate that they are no longer available to DUT 101. Un-shaded channels 85 and 87 denote that the requested resources have been reassigned to embedded processor 170 and that the requested resources are now available to DUT 201.

As illustrated in FIG. 4C, embedded processor 170 now has the desired tester resources made available by tester workstation 15 through embedded processor 70, and may perform the task necessary to complete the testing of DUT 201. Shaded DUT pins 185 and 187 illustrate how embedded processor 170 has applied the requested resources to DUT 201 to continue testing the device.

Figure 5:
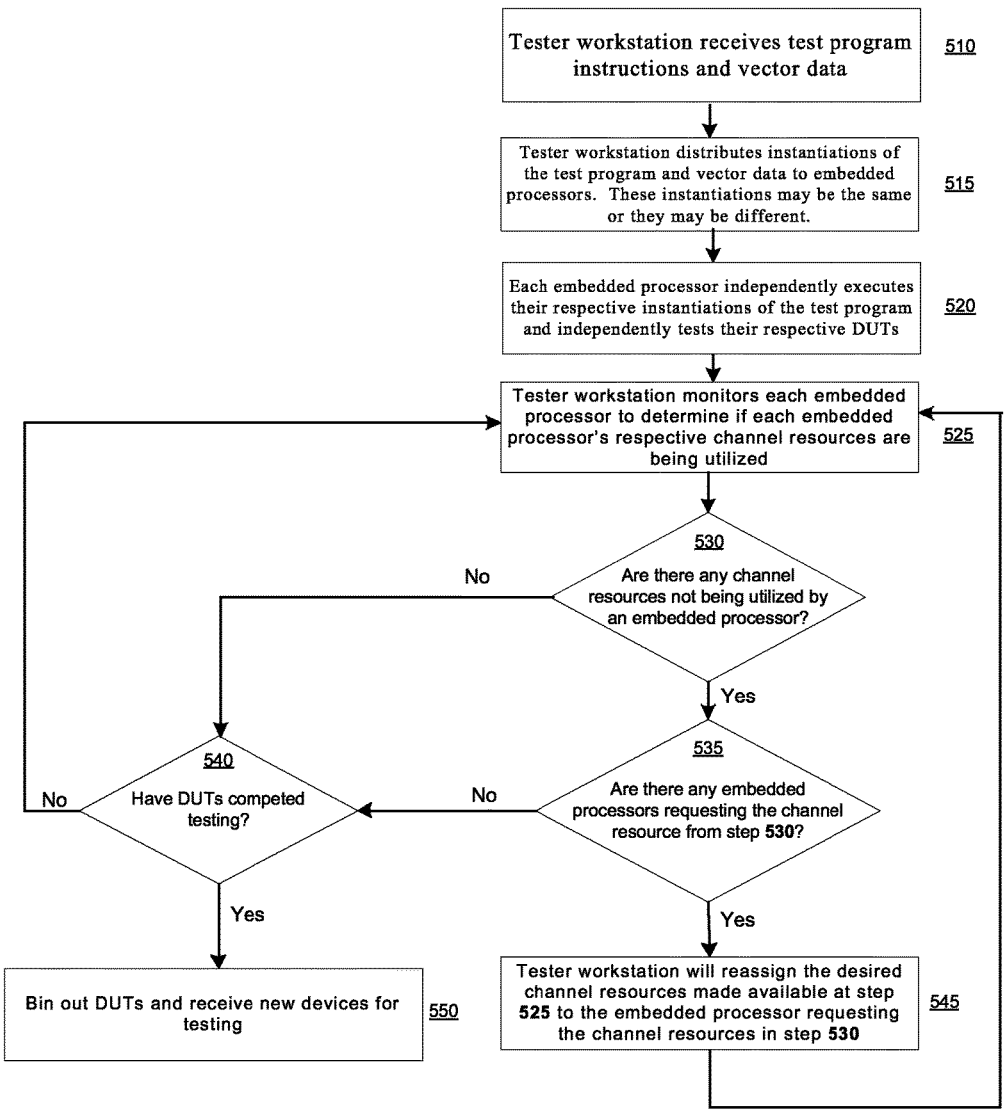
FIG. 5 depicts a flowchart of an exemplary resource allocation process in accordance with embodiments of the present invention.

FIG. 5 is a flowchart which describes exemplary steps in accordance with the various embodiments herein described.

At step 510, the tester workstation receives test program instructions and vector data through an input/output port. Vector data may consist of signal data which may be stimuli that is applied to a device under test (DUT) or the data may be in the form of measured responses from the DUT. Stimulus signals may be in the form of 1's and 0's depicting various logical states or characterized as voltages. Vector data may further be depicted as a sequential pattern consisting of 1's and 0's read from memory.

At step 515, each embedded processor receives its own instantiation of the instructions of the test program as well as the vector data from the tester workstation which are then executed by each embedded processor using the available channel resources located within each embedded processor's jurisdiction. Each embedded processor may independently execute a test different program from each other or they may each execute the same test program.

At step 520, each embedded process independently executes their respective instantiations of the test program on their respective DUTs. Furthermore, each embedded processor independently tests their respective DUTs.

At step 525, the tester workstation monitors each embedded processor for any status updates regarding the utilization of their respective channel resources to determine if each embedded processor's respective channel resources are being utilized.

At step 530, a determination is made to determine if an embedded processor has any channel resources that are not being utilized. If an embedded processor has a channel resource that is not being utilized, then another determination is made by the tester workstation to see if there are any embedded processors that are requesting that particular resource, as detailed in step 535. If no embedded processors are requesting a resource, then another determination is made to determine if the DUTs have completed testing, as detailed in step 540.

At step 535, a determination is made to see if there are any embedded processors that are requesting that particular resource. If there are embedded processors requesting that particular resource, the tester workstation will communicate with the embedded processor in possession of the desired channel resource and request the embedded processor to make the channel resource available for other embedded processors, as detailed in step 545. If no embedded processors are requesting a resource, then another determination is made to determine if the DUTs have completed testing, as detailed in step 540.

At step 540, a determination is made as to whether the DUTs have completed testing. If they have completed testing, the tester workstation bins out those devices and receives new devices for testing, as detailed in step 550. If they have not completed testing, the tester workstation will then continue to monitor each embedded processor, as detailed in in step 525.

At step 545, the tester workstation will reassign the desired channel made available to the embedded processor requesting the channel resource and continue monitoring the embedded processors, as detailed in in step 525.

At step 550, the tester workstation bins out those devices that have completed testing and receives new devices for testing.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only.

For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A tester system comprising:
    a central controller for coordinating testing of a plurality of devices under test;
    a plurality of channel circuits, each channel circuit operable to be coupled to at least one I/O pin of a device under test of said plurality of devices under test; and
    a plurality of intermediate processors each coupled to said central controller and each operable to receive control signals therefrom and operable to send control signals thereto, wherein further, each intermediate processor is coupled to a different set of channel circuits of said plurality of channel circuits and wherein each intermediate processor is operable to execute a respective test program independent of any other intermediate processor of said plurality of intermediate processors for the testing of a device under test associated therewith.

2. A tester system as described in claim 1 wherein each intermediate processor of said plurality of intermediate processors is operable to execute a respective instantiation of a test program for application to an associated device under test using an associated set of channel circuits coupled thereto.

3. A test system as described in claim 2 wherein a first set of said plurality of intermediate processors respectively execute a first test program for testing a first set of devices under test in lock step execution and wherein a second set of said plurality of intermediate processors respectively execute a second test program for testing a second set of devices under test and wherein further said second test program is different from and independent of said first test program.

4. A tester system as described in claim 1 wherein each of said plurality of intermediate processors is an embedded processor.

5. A test system as described in claim 1 wherein said plurality of channel circuits comprise:
    clock pin channel circuits;
    analog input channel circuits;
    analog output channel circuits; and
    digital input/output channel circuits.

6. A test system as described in claim 1 wherein each intermediate processor of said plurality of intermediate processors is coupled to independently receive respective vector data from said central controller.

7. A test system as described in claim 1 wherein said central controller is a tester workstation.

8. A method for testing a plurality of devices under test, comprising:
    coordinating testing of a plurality of devices under test using a central controller;
    coupling a plurality of channel circuits to at least one I/O pin of a device under test of said plurality of devices under test, wherein each channel circuit is operable to be coupled to at least one I/O pin of a device under test of said plurality of devices under test;
    associating a plurality of intermediate processors, each operable to receive control signals therefrom and operable to send control signals thereto, to said central controller, wherein said central controller is operable to monitor an operational status of said plurality of channel circuits;
    associating each intermediate processor of said plurality of intermediate processors to a different set of channel circuits of said plurality of channel circuits and wherein each intermediate processor is operable to execute a respective test program independent of any other intermediate processor of said plurality of intermediate processors for the testing of a device under test associated therewith.

9. A method for testing a plurality of devices under test as described in claim 8 wherein each intermediate processor of said plurality of intermediate processors is operable to execute a respective instantiation of a test program for application to an associated device under test using an associated set of channel circuits coupled thereto.

10. A method for testing a plurality of devices under test as described in claim 9 wherein a first set of said plurality of intermediate processors is operable to respectively execute a first test program for testing a first set of devices under test in lock step execution and wherein a second set of said plurality of intermediate processors is operable to respectively execute a second test program for testing a second set of devices under test and wherein further said second test program is different from and independent of said first test program.

11. A method for testing a plurality of devices under test as described in claim 8 wherein each of said plurality of intermediate processors is an embedded processor.

12. A method for testing a plurality of devices under test as described in claim 8 wherein said plurality of channel circuits comprise:
    clock pin channel circuits;
    analog input channel circuits;

analog output channel circuits; and digital input/output channel circuits.

13. A method for testing a plurality of devices under test as described in claim 8 wherein each intermediate processor of said plurality of intermediate processors is coupled to receive respective vector data from said central controller.

14. A method for testing a plurality of devices under test as described in claim 8 wherein said central controller is a tester workstation.

15. A tester system comprising:
   a central controller for coordinating testing of a plurality of devices under test;
   a plurality of channel circuits, each channel circuit operable to be communicatively coupled to at least one I/O pin of a device under test of said plurality of devices under test; and
   a plurality of intermediate processors each communicatively coupled to said central controller and each operable to receive control signals therefrom and operable to send control signals thereto, wherein further, each intermediate processor is communicatively coupled to a different set of channel circuits of said plurality of channel circuits and wherein each intermediate processor is operable to execute a set of instructions of a respective instantiation of a test program concurrently for the testing of a device under test associated therewith.

16. A tester system as described in claim 15 wherein each intermediate processor of said plurality of intermediate processors is operable to execute a respective instantiation of a test program for application to an associated device under test using an associated set of channel circuits coupled thereto.

17. A test system as described in claim 16 wherein a first set of said plurality of intermediate processors is operable to respectively execute a first test program for testing a first set of devices under test in lock step execution and wherein a second set of said plurality of intermediate processors is operable to respectively execute a second test program for testing a second set of devices under test and wherein further said second test program is different from and independent of said first test program.

18. A test system as described in claim 15 wherein each of said plurality of intermediate processors is an embedded processor.

19. A test system as described in claim 15 wherein said plurality of channel circuits comprise:
   clock pin channel circuits;
   analog input channel circuits;
   analog output channel circuits; and
   digital input/output channel circuits.

20. A test system as described in claim 15 wherein each intermediate processor of said plurality of intermediate processors is coupled to receive respective vector data from said central controller.

21. A test system as described in claim 15 wherein said central controller is a tester workstation.

\* \* \* \* \*